United States Patent
Chai et al.

(10) Patent No.: US 11,848,336 B2
(45) Date of Patent: Dec. 19, 2023

(54) ARRAY SUBSTRATE, DISPLAY PANEL, AND DISPLAY APPARATUS

(71) Applicants: WUHAN TIANMA MICRO-ELECTRONICS CO., LTD., Wuhan (CN); WUHAN TIANMA MICROELECTRONICS CO., LTD. SHANGHAI BRANCH, Shanghai (CN)

(72) Inventors: Huiping Chai, Shanghai (CN); Lijing Han, Shanghai (CN); Guobing Wang, Shanghai (CN)

(73) Assignees: WUHAN TIANMA MICRO-ELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 105 days.

(21) Appl. No.: 17/466,666

(22) Filed: Sep. 3, 2021

(65) Prior Publication Data
US 2021/0399023 A1    Dec. 23, 2021

(30) Foreign Application Priority Data
Jul. 13, 2021   (CN) .......................... 202110789167.0

(51) Int. Cl.
*H01L 27/12*   (2006.01)
*H01L 29/786*   (2006.01)

(52) U.S. Cl.
CPC ...... *H01L 27/1251* (2013.01); *H01L 27/1222* (2013.01); *H01L 29/7869* (2013.01)

(58) Field of Classification Search
CPC ........... H01L 29/78696; H01L 27/1218; H01L 27/1222; H01L 27/124; H01L 27/1285;
(Continued)

(56) References Cited

U.S. PATENT DOCUMENTS

2012/0146043 A1\* 6/2012 Kitakado .......... H01L 29/78648
                                                              257/E27.06
2017/0133516 A1    5/2017 Ren et al.

FOREIGN PATENT DOCUMENTS

| CN | 103109373 A | 5/2013 |
| CN | 105759527 A | 7/2016 |
| CN | 110660830 A | 1/2020 |

OTHER PUBLICATIONS

English Translation of the First Chinese Office Action dated Aug. 29, 2023, issued in the corresponding Chinese Application No. 202110789167.0, filed Jul. 13, 2021, 9 pages.

\* cited by examiner

*Primary Examiner* — Mohammed R Alam
(74) *Attorney, Agent, or Firm* — CHRISTENSEN O'CONNOR JOHNSON KINDNESS PLLC

(57) ABSTRACT

An array substrate, a display panel, and a display apparatus are provided. The array substrate includes a substrate and a first thin-film transistor located on the substrate. In an embodiment, the first thin-film transistor includes a channel and a gate electrode. In an embodiment, an orthographic projection of the gate electrode on the substrate overlaps with an orthographic projection of the channel on the substrate. In an embodiment, the gate electrode comprises a first zone and a second zone that are arranged in a first direction. In an embodiment, the channel overlapping with the first zone in a direction perpendicular to the substrate has a total width $W_1$ in a second direction perpendicular to the first direction, the channel overlapping with the second zone in a direction perpendicular to the substrate has a total width $W_2$ in the second direction, and $W_1/W_2 \leq 3$.

20 Claims, 9 Drawing Sheets

(58) Field of Classification Search
CPC ........... H01L 27/1296; H01L 29/78645; H01L 29/78675; H01L 29/78678
See application file for complete search history.

ARRAY SUBSTRATE, DISPLAY PANEL, AND DISPLAY APPARATUS

CROSS-REFERENCE TO RELATED APPLICATIONS

The present application claims priority to Chinese Patent Application No. 202110789167.0, filed on Jul. 13, 2021, the content of which is incorporated herein by reference in its entirety.

TECHNICAL FIELD

The present disclosure relates to the field of display technologies, and, particularly, relates to an array substrate, a display panel, and a display apparatus.

BACKGROUND

An array substrate includes transistors, channels of which are located in a semiconductor thin-film layer of the array substrate. In a technical process, the semiconductor thin film is required to be processed by a laser crystallization process to serve as the channel of the transistor. A mainstream technology is an excimer laser annealing technology, in which laser beams are used to scan an amorphous silicon layer so that the amorphous silicon layer is crystallized to form a polysilicon film. When using the excimer laser annealing technology, the laser beam is stepped along a certain direction with a fixed step size, and a formed polysilicon film has a characteristic periodic crystallization change, causing a difference in channel performance of different transistors. When pixels are driven to emit light, brightness is different, resulting in an uneven display brightness in a display region.

SUMMARY

In a first aspect of the present disclosure, an array substrate is provided. The array substrate includes a substrate and a first thin film transistor located on the substrate. The first thin film transistor includes a channel and a gate electrode, and an orthographic projection of the gate electrode on the substrate overlaps with an orthographic projection of the channel on the substrate. The gate electrode has a first zone and a second zone that are arranged in a first direction. The channel overlapping with the first zone in a direction perpendicular to the substrate has a total width $W_1$ in a second direction perpendicular to the first direction, the channel overlapping with the second zone in a direction perpendicular to the substrate has a total width $W_2$ in the second direction, and $W_1/W_2 \leq 3$.

In a second aspect of the present disclosure, a display panel is provided. The display panel includes the above array substrate.

In a third aspect of the present disclosure, a display apparatus is provided. The display apparatus includes the above display panel.

DRIVING TRANSISTORBRIEF DESCRIPTION OF DRAWINGS

In order to more clearly explain the embodiments of the present disclosure or the technical solution in the related art, the drawings used in the description of the embodiments or the related art will be briefly described below. The drawings in the following description are some embodiments of the present disclosure. Those skilled in the art may obtain other drawings based on these drawings.

DESCRIPTION OF EMBODIMENTS

In order to more clearly illustrate objects, technical solutions and advantages of embodiments of the present disclosure, the technical solutions in the embodiments of the present disclosure are clearly and completely described below with reference to the accompanying drawings in the embodiments of the present disclosure. The described embodiments are merely part of the embodiments of the present disclosure rather than all of the embodiments. All other embodiments obtained by those skilled in the art shall fall into the scope of the present disclosure.

The terms used in the embodiments of the present disclosure are merely for the purpose of describing specific embodiment, rather than limiting the present disclosure. The terms "a", "an", "the" and "said" in a singular form in the embodiments of the present disclosure and the attached claims are also intended to include plural forms thereof, unless noted otherwise.

Figure 1:
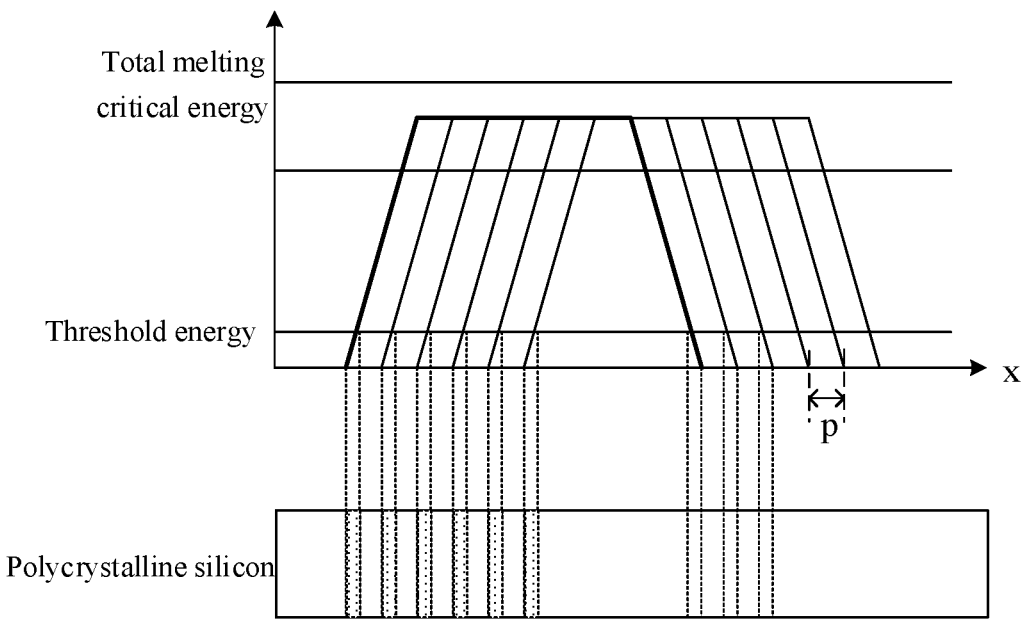
FIG. 1 is a schematic diagram showing a laser crystallization process in the related art.

FIG. 1 is a schematic diagram showing a laser crystallization process in the related art. As shown in FIG. 1, laser beams travel with a step size p along a first direction x.

Crystallization defects caused by a front edge of the laser beam may be restored by a subsequent laser pulse; however, crystallization defects caused by a back edge of the laser beam may be periodically distributed. For different pixels, the back edge of the laser beam may fall on different positions of a channel of a driving transistor. Alternatively, scanning times of the channel, that are scanned by the back edge of the laser beam, of the driving transistors in different pixels is different. As a result, there is a difference in performances of the driving transistors in different pixels so that threshold compensation capabilities of the driving transistors between pixels are different, resulting in brightness differences, and affecting display uniformity.

In view of the above, the present disclosure provides an array substrate. By designing a shape of a channel of a transistor of the array substrate, performance difference of driving transistors between different pixels is improved after a laser crystallization process, thereby improving display uniformity.

Figure 2:
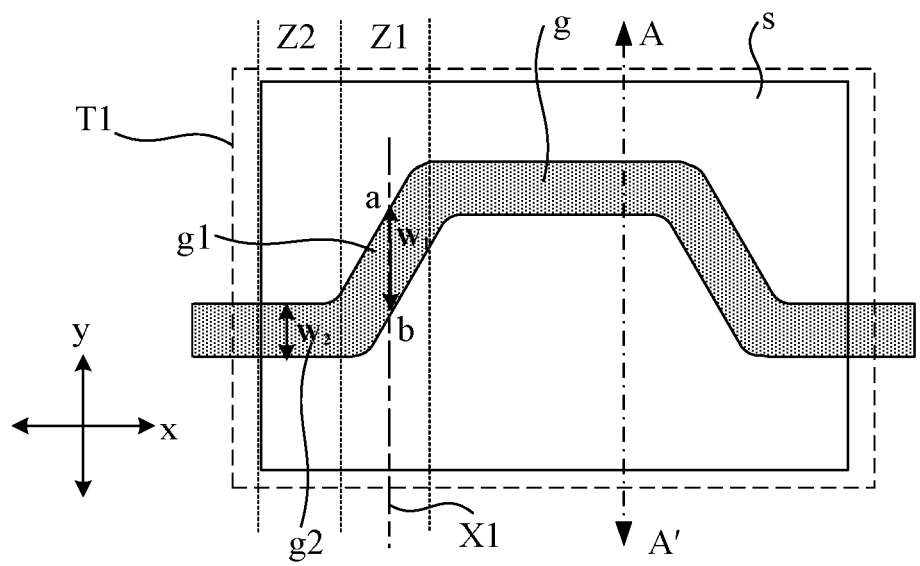
FIG. 2 is a schematic diagram showing a first transistor of an array substrate according to an embodiment of the present disclosure.
Figure 3:
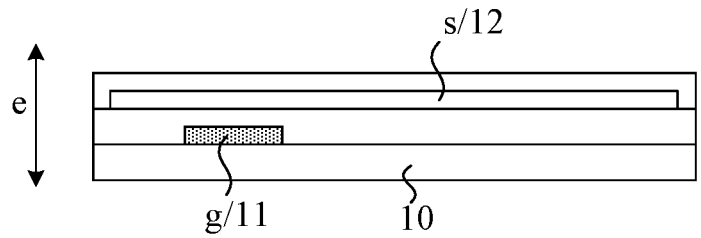
FIG. 3 is a cross-sectional view along line A-A' shown in FIG. 2 according to an embodiment of the present disclosure.

FIG. 2 is a schematic diagram showing a first transistor of an array substrate according to an embodiment of the present disclosure, and FIG. 3 is a cross-sectional view along line A-A' shown in FIG. 2.

As shown in FIG. 2 and FIG. 3, the array substrate includes a substrate 10 and a first thin-film transistor T1 located on the substrate 10. The first thin-film transistor T1 includes a channel g and a gate electrode s. An orthographic projection of the gate electrodes on the substrate 10 overlaps with an orthographic projection of the channel g on the substrate 10. The channel is made of a materials including silicon. It can be seen from FIG. 3 that the array substrate includes at least a semiconductor layer 11 and a first metal layer 12. The channel g is located in the semiconductor layer 11, and the gate electrodes is located in the first metal layer 12. A region of the semiconductor layer 11 where the semiconductor layer 11 overlaps with the gate electrodes is the channel g of the first thin-film transistor T1. In an embodiment, the first thin-film transistor T1 is a driving transistor in the pixel circuit.

It can be seen from FIG. 2 that the gate electrodes includes a first zone Z1 and a second zone Z2 that are arranged in a first direction x. The first direction x is a direction along which the laser beam travels in a laser crystallization process of a semiconductor layer. It can be seen from FIG. 2 and FIG. 3 that the first zone Z1 overlaps with a portion of the channel g in a direction e perpendicular to the substrate and the second zone Z2 also overlaps with a portion of the channel g in the direction e perpendicular to the substrate.

In an embodiment of the present disclosure, the channel g, overlapping with the first zone Z1 in the direction e perpendicular to the substrate 10, has a total width $W_1$ in a second direction y, and the channel, overlapping with the second zone Z2 in the direction e perpendicular to the substrate 10, has a total width $W_2$ in the second direction y, and $W_1/W_2 \leq 3$. The second direction y is perpendicular to the first direction x.

As shown in FIG. 2, the channel g includes a first subsection g1 and a second subsection g2. The first subsection g1 of the channel g overlaps with the first zone Z1, and the second subsection g2 overlaps with the second zone Z2. In an embodiment, one first zone Z1 overlaps with one first zone g1, and one second zone Z2 overlaps with one second subsection g2. The channel g overlapping with the first zone Z1 having the total width $W_1$ in the second direction y means that the first subsection g1 has a width of $W_1$ in the second direction y. The channel g overlapping with the second zone Z2 having the total width $W_2$ in the second direction y means that the second subsection g2 has a width of $W_2$ in the second direction y.

It can be seen from FIG. 2 that an extension direction of the first subsection g1 is parallel to neither the first direction x nor the second direction y. The width of the first subsection g1 in the second direction y can be determined as follows: a straight line X1 extending in the second direction y passes through the first subsection g1 to form two intersection points between the straight line X1 and the edge of the first subsection g1, such as two intersection points a and b as shown in FIG. 2, so that a distance between a and b is the width of the first subsection g1 in the second direction y.

In an embodiment shown in FIG. 2, the channel g is in an approximated "几" shape. In an embodiment of the present disclosure, the shape of the channel g can also be approximately as a Chinese character "弖" shape. The meanings of $W_1$ and $W_2$ in the first transistor including the channel having a Chinese character "弖" shape will be described in following embodiments.

In the array substrate according to embodiments of the present disclosure, the gate electrode g of the first transistor T1 includes a first zone Z1 and a second zone Z2 that are arranged in the first direction x. The first direction x is the same as the traveling direction of the laser beam in the laser crystallization process. A ratio of the total width $W_1$, in the second direction y, of the channel g overlapping with the first zone Z1 to the total width $W_2$, in the second direction y, of the channel overlapping with the second zone Z2 is not greater than 3. The second direction y is perpendicular to the first direction x. In the laser crystallization process, the channel g overlapping with the first zone Z1 is scanned by the laser beam with a total width of $W_1$, and the channel g overlapping with the second zone Z2 is scanned by the laser beam with a total width of W2. By setting $W_1/W_2 \leq 3$, a difference in crystallization defects caused by the back edge of the laser beam falling in the channel g overlapping with the first zone Z1 and falling in the channel g overlapping with the second zone Z2 can be reduced, so that it is possible to reduce a difference in channel performance of the first transistors T1 in different pixels. Improvement of performance difference of the first transistors T1 caused by the back edge of the laser beam scanning at different positions of the channel g of the first transistor T1 can reduce a difference in the threshold compensation capability of the driving transistors in different pixels, thereby improving display uniformity.

Figure 4:
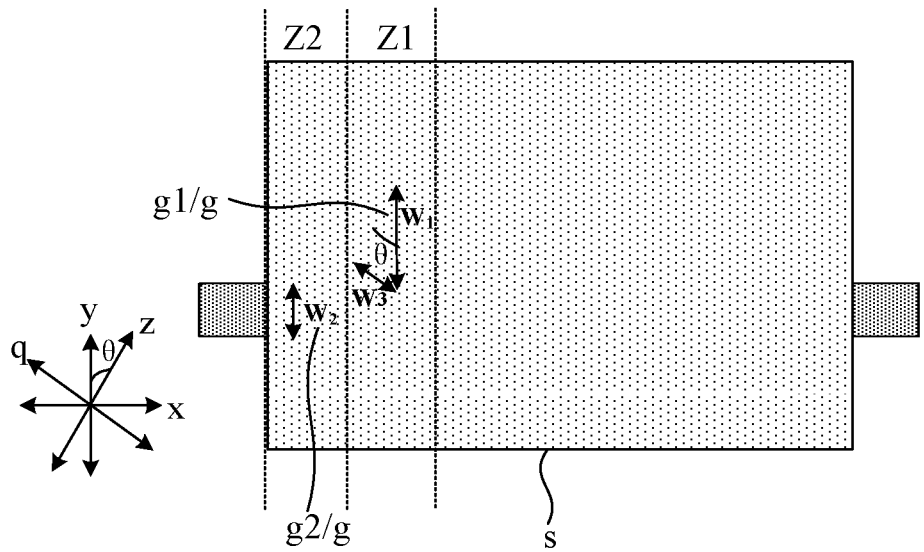
FIG. 4 is a schematic diagram showing a first transistor of an array substrate according to another embodiment of the present disclosure.

FIG. 4 is a schematic diagram showing a first transistor in an array substrate according to another embodiment of the present disclosure. In an embodiment, as shown in FIG. 4, the gate electrodes includes a first zone Z1 and a second zone Z2 that are arranged in a first direction x. The first subsection g1 of the channel g overlaps with the first zone Z1, the first subsection g1 extends along the third direction z, and an angle θ formed between the third direction z and the second direction y satisfies 0°<θ<90°. The second subsection g2 of the channel g overlaps with the second zone Z2, and the second subsection g2 extends along the first direction x. A width of the first subsection g1 in the second direction y is W1, and a width of the second subsection g2 in the second direction y is W2. The width of the first subsection g1 in the second direction y can determined with reference to the above-mentioned related description. In this embodiment, the extension direction of the first subsection g1 is different from the extension direction (i.e., the first direction x) of the second subsection g2, so that a channel length of the first transistor can be increased. However, assuming that the extension direction of the first subsection g1 is the same as the second direction y, the width of the first subsection g1 in the second direction y is larger, resulting a significant difference in crystallization defects caused by the back edge of the laser beam falling on the first subsection g1 and falling on the second subsection g2. In the present disclosure, the extension direction of the first subsection g1 is parallel to neither the first direction x nor the second direction y, which increases a channel length of the first transistor T1 while reducing the difference in crystallization defects caused by the back edge of the laser beam falling on the channel g that overlaps with the first zone Z1 and falling on the channel g that overlaps with the second zone Z2, thereby reducing a difference in the channel performance of the first transistors T1 in different pixels.

It can be understood that, for the shape of the channel g shown in FIG. 4, the channel length of the first transistor T1 is not the total length occupied by the channel g in the first direction x. It can be understood that, the first transistor T1 further includes a source region and a drain region. One end of the channel g can be connected to the source region, and another end of the channel g is connected to the drain region. A length of a conductive channel for conduction between the source region and the drain region is the channel length of the transistor. In an embodiment shown in FIG. 4, the channel length of the first transistor is a sum of lengths of respective subsections of the channel g in its extension direction.

In an embodiment shown in FIG. 4, it is equivalent to dividing the channel g according to the extension directions of subsections of the channel g. The subsection, extending along the first direction x, of the channel g is the second section g2, and a subsection extending in a direction parallel to neither the first direction x nor the second direction y is the first subsection g1.

FIG. 4 further shows a fourth direction q that is perpendicular to the third direction z. A width of the first subsection g1 of the channel g in the fourth direction q is $W_3$. In an embodiment, the widths of the first subsection g1 in the fourth direction q at the respective positions are substantially the same. According to the above description about the width $W_2$ of the first subsection g1 in the second direction y, it can be learned that $\sin\theta = W_3/W_1$. When $W_3$ is constant, the larger $\theta$ is, the smaller $W_1$ is.

In an embodiment, since $\sin\theta = W_2/W_1$, $W_3 = W_2$. That is to say, the width $W_3$ of the first subsection g1 in a direction perpendicular to its extension direction is equal to the width $W_2$ of the second subsection g2 in a direction perpendicular to its extension direction. When designing the channel of the first transistor, regardless of influence of difference in the laser crystallization process, only influence of the length of the first subsection g1 in its extension direction (third direction z) on the performance of the channel g can be taken into account, so that the design of the first transistor is simpler.

Figure 5:
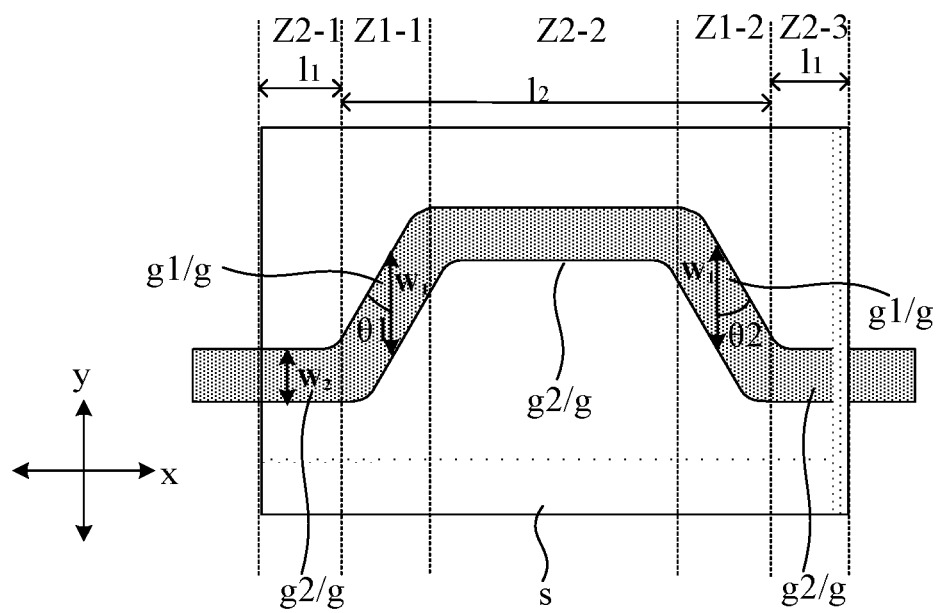
FIG. 5 is a schematic diagram showing a first transistor of an array substrate according to another embodiment of the present disclosure.

FIG. 5 is a schematic diagram showing a first transistor of an array substrate according to another embodiment of the present disclosure. In an embodiment, as shown in FIG. 5, in the channel g, each of two ends of the first subsection g1 is connected to one second subsection g2. The channel g includes three second subsections g2 and two first subsections g1. Correspondingly, the gate electrodes is divided into three second zones and two first zones. A second zone Z2-1, a first zone Z1-1, a second zone Z2-2, a first zone Z1-2, and a second zone Z2-3 are sequentially arranged in the first direction x. In the laser crystallization process, for different pixels, when the back edge of the laser beam all scans in the first zone or in the second zone, a performance difference of the first transistors of different pixels is small. However, when the back edge of the laser beam scans the first zone and the second zone, the performance difference of the first transistors of different pixels is greatly affected.

In an embodiment shown in FIG. 5, an extension direction of the first subsection g1 that overlaps with the first zone Z1-1 is parallel to neither the first direction x nor the second direction y, and forms an angle $\theta 1$ with the second direction y, and $\theta 1$ satisfies $0° < \theta 1 < 90°$. An extension direction of the first section g1 that overlaps with the first zone Z1-2 is parallel to neither the first direction x nor the second direction y, and forms an angle $\theta 2$ with the second direction y, and $\theta 2$ satisfies $0° < \theta 2 < 90°$. In an embodiment, $\theta 1 = \theta 2$.

Taking the lengths of the second zone Z2-1 and Z2-3 in the first direction x being $l_1$ and a sum of the length of the first zone Z1-2 and the length of the second zone Z2-2 in the first direction x being $l_2$ as an example, in the channel g, a length, in the first direction x, of the second subsection g2 overlapping with the second zone Z2-1, and a length, in the first direction x, of the second subsection g2 overlapping with the second zone Z2-3 are both $l_1$. A total length, in the first direction x, occupied by the channel g overlapping with the first zone Z1-1, the first zone Z1-2, and the second zone Z2-2 is $l_2$. A total length, in the first direction x, occupied by the channel g overlapping with the gate electrode is $l_1 + l_2$.

The first direction x is a traveling direction of the laser beam in the laser crystallization process, and a step size, with which the laser beam travels, is p.

When $l_2 + 2*l_1 > p \geq l_2 + l_1$, for the first transistors corresponding to different pixels, the back edge of the laser beam can scan the portion (i.e., the second subsection g2) corresponding to the second zone Z2 in the channel g twice or scan the portion (i.e., the first subsection g1) corresponding to the first zone Z1 in the channel g one time. A total width of the channel g corresponding to the second zone Z2 in the second direction y is $W_2$, and a total width of the channel corresponding to the first zone Z1 in the second direction y is $W_1$. That is, a difference in the channels of the first transistors in different pixels lies in that: a total width of partial regions of the channel g that is scanned by the back edge of the laser beam is $2*W_2$ (a sum of widths of two second subsections g2 corresponding to two second zones Z2), or, a total width of partial regions of the channel g that is scanned by the back edge of the laser beam is $W_1$. When $W_1/W_2 \leq 3$, i.e., $W_1 \leq 3*W_2$, the difference in the total width of the portions, that are scanned by the back edge of the laser beam, of the channel of the first transistor in different pixels can be reduced, so that the performance difference in channels of the first transistors of different pixels can be reduced. In an embodiment, $W_1/W_2 < 2$, when $W_1/W_2 = 2$, the crystallization defect caused by scanning the portion corresponding to the second zone Z2 in the channel g twice by the back edge of the laser beam is basically the same as the crystallization defect caused by scanning the portion corresponding to the first zone Z1 once by the back edge of the laser beam. That is, in this case, the performance difference of the first transistor between different pixels is small, so that display uniformity can be improved.

When $p \geq l_2 + 2*l_1$, for the first transistors in different pixels, the back edge of the laser beam can scan a portion corresponding to the second zone Z2 in the channel g once or scan a portion corresponding to the first zone Z1 in the channel g once. That is, the difference in the channel of the first transistor between different pixels lies in that: a total width of a partial region of the channel g that is scanned by the back edge of the laser beam is $W_2$, or a total width of a partial region of the channel g that is scanned by the back edge of the laser beam is $W_1$. When $W_1/W_2 \leq 3$, the difference in the total width of the portions, that are scanned by the back edge of the laser beam, of the channels of the first transistors in different pixels can be reduced, so that the channel performance difference of the first transistors between different pixels can be reduced. In an embodiment, $W_1/W_2 \leq 2$, which further reduces the difference in the total width of the portions, that are scanned by the back edge of the laser beam, of the channels of the first transistors in different pixels.

When $p<1_2$, for the first transistors in different pixels, the back edge of the laser beam can scan a portion of the channel g corresponding to the second zone Z2 once, or scan a portion of the channel g corresponding to the first zone Z1, or simultaneously scan a portion corresponding to the first zone Z1 and a portion corresponding to the second zone Z2 in the channel g once. In this case, when $W_1/W_2 \leq 3$ is designed in embodiments of the present disclosure, the step size p of the laser beam traveling in the laser crystallization process is adjusted at the same time, thereby reducing the difference in the total width of portions, that are scanned by the back edge of the laser beam, of the channels of the first transistors in different pixels.

In an embodiment, $19.5° \leq \theta < 90°$. If $\sin 19.5° \approx 0.3338$, then $W_1/W_2 \approx 2.9954 < 3$. In an embodiment, $1 < W_1/W_2 < 3$. Referring to FIG. 4, when the length of the first subsection g1 in the third direction z is constant, and the width W3 of the first subsection g1 in the fourth direction q is constant, the smaller θ is, the larger W1 is, resulting in a significant difference in the crystallization defects caused by the back edge of the laser beam falling in the first subsection g1 and falling in the second subsection g2. In an embodiment of the present disclosure, $\theta \geq 19.5°$, achieving a sufficient large θ and thus reducing the difference in crystallization defects caused by the back edge of the laser beam scanning the first subsection g1 and the second subsection g2. Meanwhile, $\theta < 90°$, which makes the extension direction of the first subsection g1 not parallel to the first direction x, so that the channel length of the first transistor can be increased while achieving that the total length of the channel g in the first direction x remains unchanged.

Figure 6:
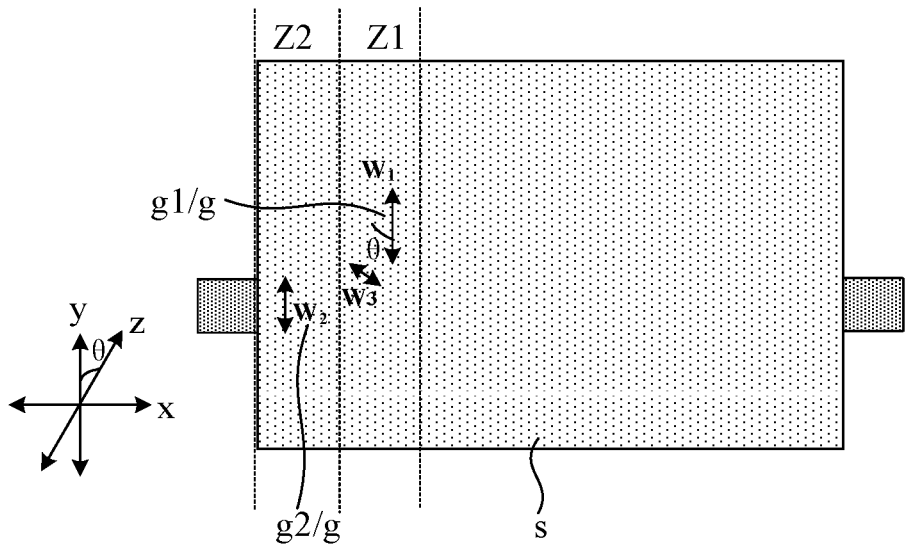
FIG. 6 is a schematic diagram showing a first transistor of an array substrate according to another embodiment of the present disclosure.

FIG. 6 is a schematic diagram showing a first transistor of an array substrate according to another embodiment of the present disclosure. In another embodiment, as shown in FIG. 6, a width of the first subsection g1 in a direction perpendicular to a third direction y is $W_3$, and $W_3 < W_2$. That is, a width of the first subsection g1 in a direction perpendicular to its extension direction is smaller than a width of the second subsection g2 in a direction perpendicular to its extension direction. When θ is constant, $W_1$ can be reduced, so that it is beneficial to reduce the difference in crystallization defects of the channel g caused by the back edge of the laser beam scanning the first subsection g1 and scanning the second subsection g2, thereby reducing the difference in performance of the channels of the first transistors T1 in different pixels.

In some embodiments, the number of the first subsection g1 is n1, and the number of the second subsection g2 is n2, where n1 and n2 each are a positive integer, and n1+1=n2. As shown in FIG. 5, n1=2, and n2=3.

Figure 7:
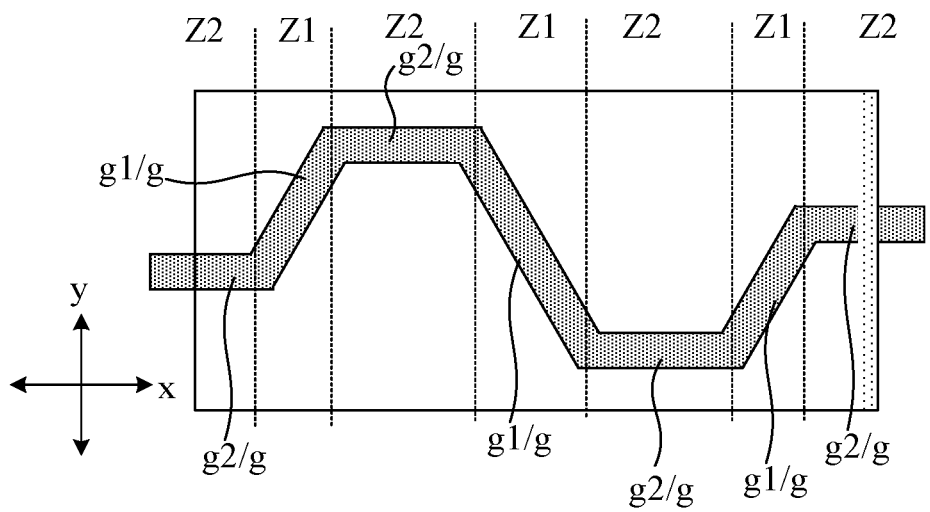
FIG. 7 is a schematic diagram showing a first transistor of an array substrate according to another embodiment of the present disclosure.

FIG. 7 is a schematic diagram showing a first transistor of an array substrate according to another embodiment of the present disclosure. In another embodiment, as shown in FIG. 7, each of two ends of the first subsection g1 in the channel g is connected to one second subsection g2, and n1=3, and n2=4. Such configuration can increase the channel length of the first transistor.

In another embodiment, the channel g includes a third subsection extending in the first direction x and a fourth subsection extending in the second direction y. At least one end of the fourth subsection is connected to the third subsection. In an embodiment, it is equivalent to dividing the channel g according to the extension directions of subsections of the channel g. The subsection of the channel g that extends along the first direction x is the third subsection, and the subsection of the channel g that extends along the second direction y is the fourth subsection. In an embodiment, the channel g has a shape of approximately a Chinese character "凵". FIG. 8 to FIG. 13 are all top views of the array substrate, a look-down direction is the same as a direction perpendicular to the substrate 10, and the substrate 10 is not shown in FIG. 8 to FIG. 13.

Figure 8:
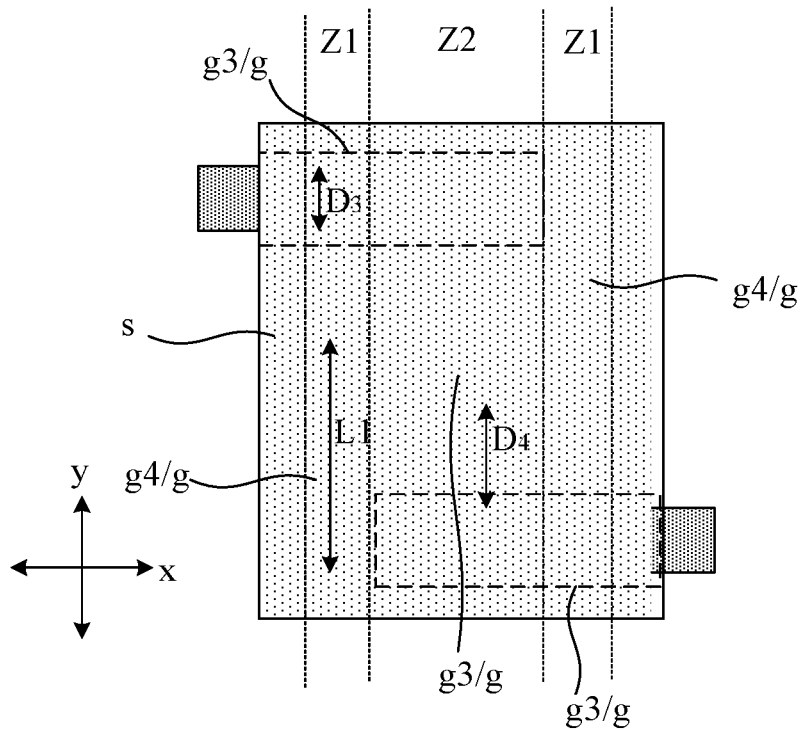
FIG. 8 is a schematic diagram showing a first transistor of an array substrate according to another embodiment of the present disclosure.

In some embodiments, the first zone overlaps with a partial region of the fourth subsection and a partial region of the third subsection, and the second zone overlaps with a partial region of at least one third subsection. FIG. 8 is a schematic diagram showing a first transistor of an array substrate according to another embodiment of the present disclosure. As shown in FIG. 8, the first zone Z1 overlaps with a partial region of one fourth subsection g4 and a partial region of one third subsection g3, and the second zone Z2 overlaps with three third subsections g3. In an embodiment, a total length, in the second direction y, of the fourth subsection g4 overlapping with the first zone Z1 is $D_1$, and a total width, in the second direction y, of the third subsection g3 overlapping with the first zone Z1 is $D_2$. The total width $W_1$, in the second direction y, of the channel g overlapping with the first zone Z1 is $D_1+D_2$. The total width, in the second direction y, of the channel g overlapping with the second zone Z2 is $W_2$, The total width, in the second direction y, of the third subsection g3 overlapping with the second zone Z2 is $W_2$.

The total length, in the second direction y, of the fourth subsection g4 overlapping with the first zone Z1 is $D_1$. The total length $D_1$ is calculated as follows. When the first zone Z1 overlaps with one fourth subsection g4, the total length, in the second direction y, of the fourth subsection g4 overlapping with the first zone Z1 is the length of one fourth subsection g4 in the second direction y. When the first zone Z1 overlaps with two or more fourth subsections g4, the total length, in the second direction y, of the fourth subsection g4 overlapping with the first zone Z1 is a sum of the lengths of two or more fourth subsection g4 in the second direction y. Similarly, for the total width $D_2$, when the first zone Z1 overlaps with one third subsection g3, $D_2$ is the width of a third subsection g3 in the second direction y. When the first zone Z1 overlaps with two third subsection g3, $D_2$ is a sum of the widths of the two third subsections g3 in the second direction y. Similarly, for $W_2$ in an embodiment of FIG. 8, when the second zone Z2 overlaps with a plurality of third subsections g3, $W_2$ is a sum of the widths, in the second direction y, of the plurality of third subsections g3 overlapping with the second zone Z2.

In an embodiment of FIG. 8, if a width of each of third subsections g3 in the second direction y is $D_3$, and the fourth subsection g4 overlapping with the first zone Z1 has a length L1 in the second direction y is, then $W_1=D_1+D_2=D_3+L_1$, and $W_2=3*D_3$.

In the laser crystallization process, a stepping direction of the laser beam is the first direction x. When the back edge of the laser beam scans in the channel g that overlaps with the first zone Z1, a total width of the channel region scanned by the back edge of the laser beam is $W_1$. When the back edge of the laser beam scans in the channel g that overlaps with the second zone Z2, a total width of the channel region scanned by the back edge of the laser beam is $W_2$. In an embodiment of the present disclosure, $W_1/W_2 \leq 3$, which can reduce a difference in the total width of the portions, that are scanned by the back edge of the laser beam, of the channel of the first transistor in different pixels, so that a difference in the channel performance of the first transistors of different pixels can be reduced. In an embodiment, $W_1/W_2 \leq 2$ can further reduce the difference in the total width of the portions, that are scanned by the back edge of the laser beam, of the channels of the first transistors in different pixels.

Referring to FIG. 8, in the second direction y, a distance between two adjacent third subsections g3 is $D_4$, then $L1 \approx 2*D_3+D_4$. $W_1=D_3+L1 \approx 3*D_3+D_4$, and $W_2=3*D_3$. When $W_1/W_2 \leq 3$, $D_4 \leq 6*D_3$. When $W_1/W_2 \leq 2$, $D_4 < 4*D_3$. That is, the smaller $D_4$ is, the smaller the difference in the total width of the portions, that are scanned by the back edge of the laser beam, of the channel of the first transistor in different pixels is, and the smaller the difference in the channel performance of the first transistors of different pixels is, thereby improving display uniformity. Moreover, the smaller $D_4$ is, the smaller the length of the first transistor in the second direction y is. Therefore, it is beneficial to save space on the array substrate, so that a larger number of pixel circuits can be arranged in the same area, thereby improving resolution.

FIG. 8 shows two first zones Z1. In an embodiment, two fourth subsections g4 respectively overlapping with the two first zones Z1 have a same length in the second direction y. In another embodiment, two fourth subsections g4 respectively overlapping with the two first zones Z1 have different lengths in the second direction y.

In an embodiment of the present disclosure, the width of the third subsection g3 in the second direction y is equal to the width of the fourth subsection g4 in the first direction x.

Figure 9:
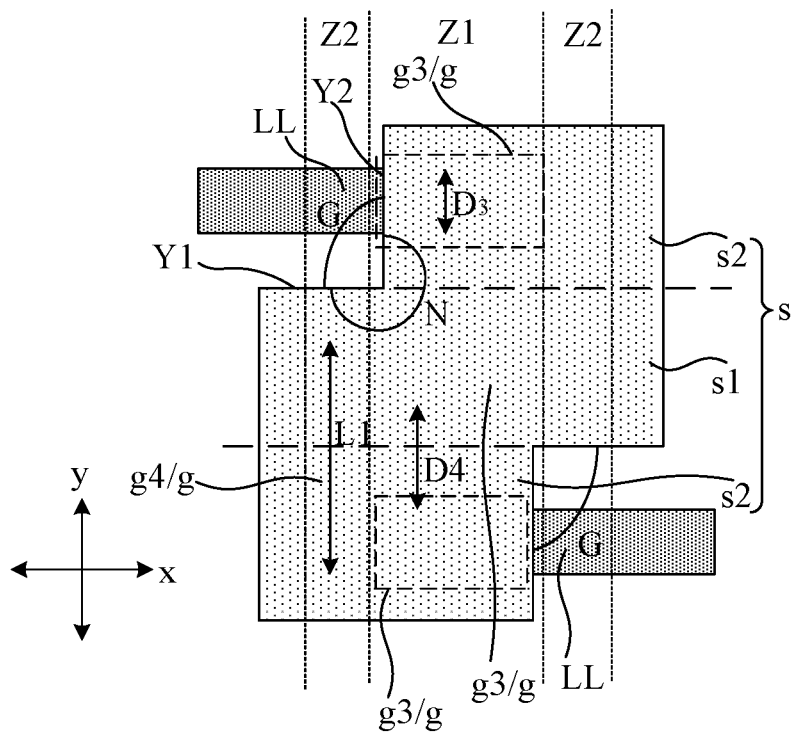
FIG. 9 is a schematic diagram showing a first transistor of an array substrate according to another embodiment of the present disclosure.

In some embodiments, the first zone overlaps with the third subsection, and the second zone overlaps with the fourth subsection. FIG. 9 is a schematic diagram showing a first transistor of an array substrate according to another embodiment of the present disclosure. As shown in FIG. 9, the first zone Z1 overlaps with the third subsection g3, the third subsection g3 overlapping with the first zone Z1 has the total width of $W_1$ in the second direction y. The second zone Z2 overlaps with the fourth subsection g4, and the fourth subsection g4 overlapping with the second zone Z2 has the total width of $W_2$ in the second direction y. The width of each third subsection g3 in the second direction y is $D_3$, and the fourth subsection g4 overlapping with the second zone Z2 has the length of L1 in the second direction y, then in an embodiment of FIG. 9, $W_1=3*D_3$, and $W_2=L1$. In an embodiment of the present disclosure, when $W_1/W_2 \leq 3$, the difference in the total width of the portions, that are scanned by the back edge of the laser beam, of the channel of the first transistor in different pixels can be reduced, so that the difference in the channel performances of the first transistors in different pixels can be reduced. In an embodiment, $W_1/W_2 \leq 2$, which can further reduce the difference in the total width of the portions, that are scanned by the back edge of the laser beam, of the channels of the first transistors in different pixels.

In some embodiments, $W_1=W_2$, that is, the total width, in the second direction y, of the channel overlapping with the first zone Z1 is equal to the total width, in the second direction y, of the channel overlapping with the second zone Z2. Since the crystallization defect caused by the back edge of the laser beam falling in the channel g overlapping with the first zone Z1 is substantially same as the crystallization defect caused by the back edge of the laser beam falling in the channel g overlapping with the second zone Z2, the channel performances of the first transistor T1 in different pixels can be reduced, so that the channel performances of the first transistor T1 are basically the same. The performance difference of the first transistor T1 caused by the back edge of the laser beam scanning at different positions of the channel g of the first transistor T1 can be improved, so that threshold compensation capabilities of the driving transistors in different pixels are substantially the same, thereby improving display uniformity.

In an embodiment, $L1=3*D_3$, a distance between two adjacent third subsections g3 in the second direction y is $D_4$, and then $D_4 \approx D_3$, and $W_1=W_2$, then the crystallization defect caused by the back edge of the laser beam falling in the channel g overlapping with the first zone Z1 is substantially same as the crystallization defect caused by the back edge of the laser beam falling in the channel g overlapping with the second zone Z2, so that the channel performance of the channel of the first transistor T1 in different pixels are basically the same, thereby improving display uniformity.

Figure 10:
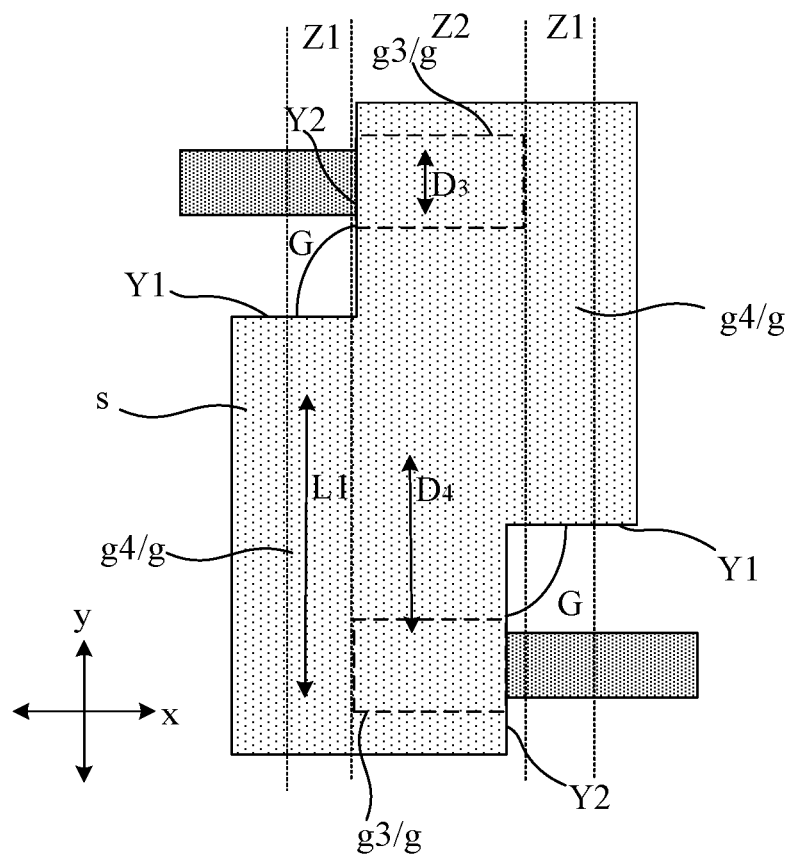
FIG. 10 is a schematic diagram showing a first transistor of an array substrate according to another embodiment of the present disclosure.

In some embodiments, the first zone overlaps with the fourth subsection, and the second zone overlaps with the third subsection. FIG. 10 is a schematic diagram showing a first transistor of an array substrate according to another embodiment of the present disclosure. As shown in FIG. 10, the first zone Z1 overlaps with the fourth subsection g4, and the fourth subsection g4 overlapping with the first zone Z1 has a total width of $W_1$ in the second direction y. A second zone Z2 overlaps with a third subsection g3, and the third subsection g3 overlapping with the second zone Z2 has a total width of $W_2$ in the second direction y. When the width of each third subsection g3 in the second direction y is $D_3$, and the fourth subsection g4, overlapping with the first zone Z1 has the length of L1 in the second direction y, in an embodiment of FIG. 10, $W_1=L1$, and $W_2=3*D_3$. In an embodiment of the present disclosure, $W_1/W_2 \leq 3$, which reduces the difference in the total width of the portions, that are scanned by the back edge of the laser beam, of the channels of the first transistors in different pixels, so that the difference in the channel performance of the first transistors in different pixels can be reduced. In an embodiment, $W_1/W_2 \leq 2$, which can reduce the difference in the total width of the portions, that are scanned by the back edge of the laser beam, of the channels of the first transistors in different pixels.

Referring to FIG. 10, if a distance between two adjacent third subsections g3 in the second direction y is $D_4$, then $L1 \approx 2*D_3+D_4$. When $W_1/W_2 \leq 3$, $D_4 \leq 7*D_3$. When $W_1/W_2 \leq 2$, $D_4 \leq 4*D_3$.

In an embodiment of the present disclosure, for a channel g of one first transistor, the number of the third subsection is m1, and the number of the fourth subsection is m2, m1 and m2 each are a positive integer, and m1≥2 and m1≥m2.

Taking FIG. 8 as an example, the number m1 of third subsections g3 is 3, and the number m2 of fourth subsections g4 is 2, where m1>m2.

Figure 11:
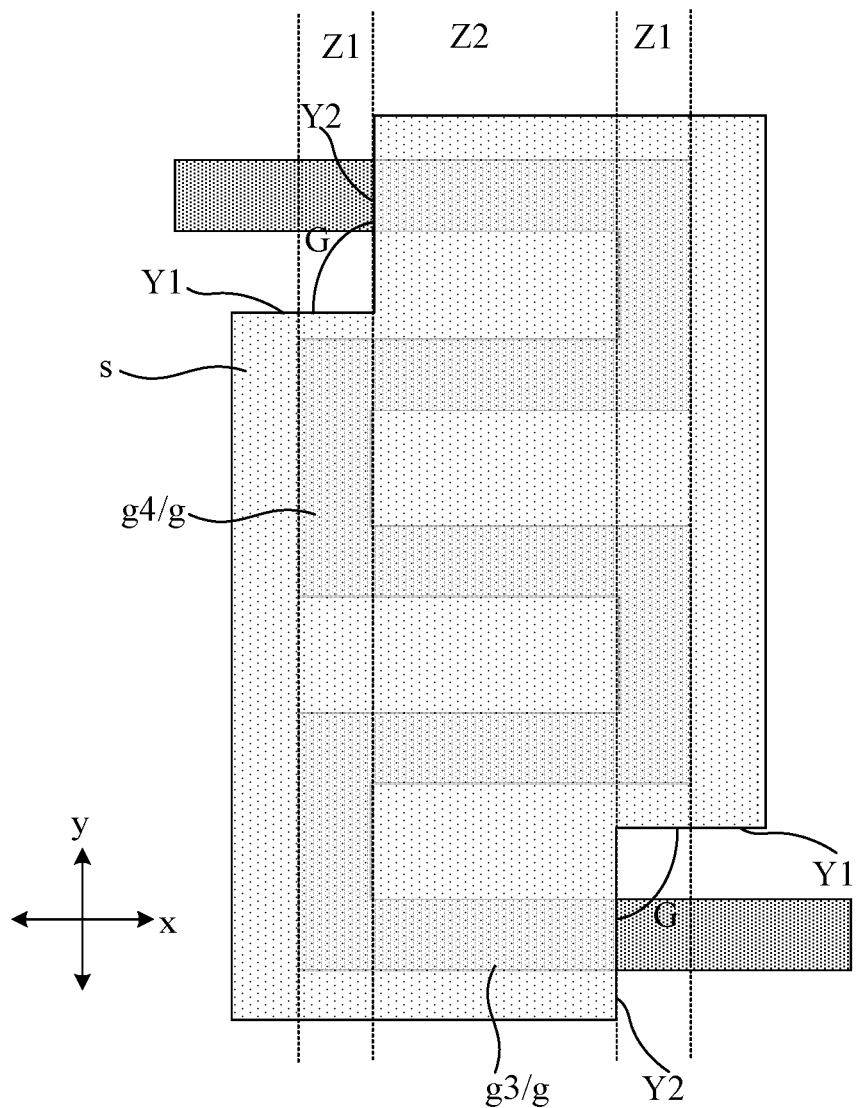
FIG. 11 is a schematic diagram showing a first transistor of an array substrate according to another embodiment of the present disclosure.

FIG. 11 is a schematic diagram showing a first transistor of an array substrate according to another embodiment of the present disclosure. In another embodiment, as shown in FIG. 11, a channel g includes a third subsection g3 extending in a first direction x and a fourth subsection g4 extending in a second direction y. A gate electrodes includes the first zone Z1 and the second zone Z2 that are arranged in the first direction x. The first zone Z1 overlaps with the fourth subsection g4. The second zone Z2 overlaps with the third subsection g3. In the embodiment of FIG. 11, each first zone Z1 overlaps with two fourth subsections g4, and the second zone Z2 overlaps with five third subsections g3. In the channel g, the number m1 of the third subsections g3 is 5, and the number m2 of the fourth subsections g4 is 4, where m1>m2.

Figure 12:
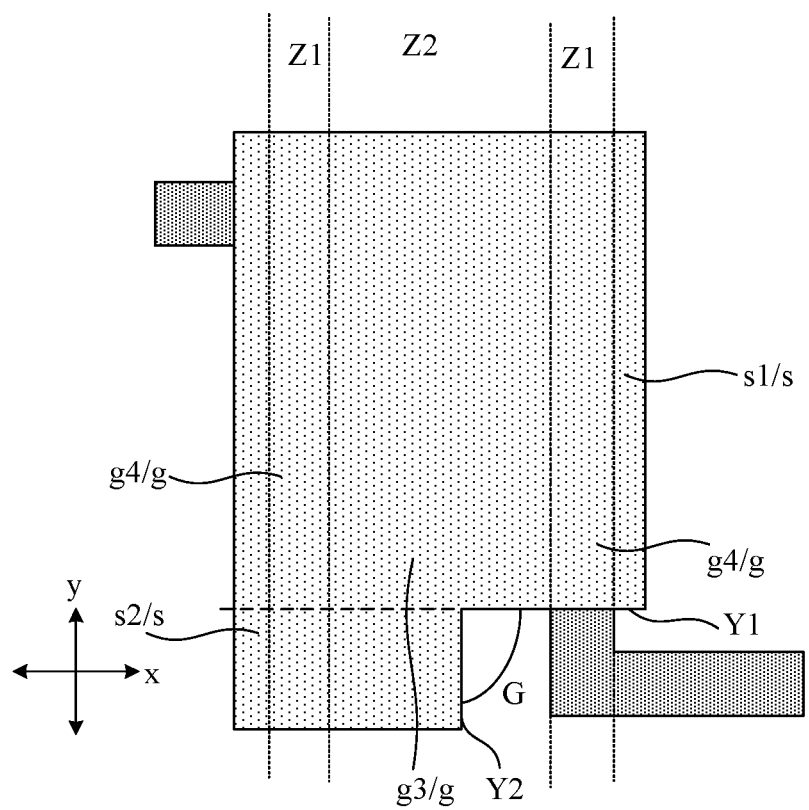
FIG. 12 is a schematic diagram showing a first transistor of an array substrate according to another embodiment of the present disclosure.

FIG. 12 is a schematic diagram showing a first transistor of an array substrate according to another embodiment of the present disclosure. In another embodiment, as shown in FIG. 12, a channel g includes a third subsection g3 extending in a first direction x and a fourth subsection g4 extending in a second direction y. A gate electrodes includes the first zone Z1 and the second zone Z2 that are arranged in the first direction x. In FIG. 12, the first zone Z1 on the left overlaps with the fourth subsection g4 and the third subsection g3, the first zone Z1 on the right overlaps with two fourth subsections g4, and the second zone Z2 in the middle overlaps with remaining three third subsections g3. In an embodiment of FIG. 12, a number m1 of the third subsections g3 is 3, and a number m2 of the fourth subsections g4 is 3, where m1=m2.

Referring to FIG. 9 again, the gate electrodes includes a body s1 and at least one protrusion s2. The protrusion s2 is connected to one end of the body s1 in the second direction y. It can be seen from FIG. 9 that a width of the protrusion s2 in the first direction x is smaller than a width of the body s1 in the first direction x.

As shown in FIG. 9, a first edge Y1 of the body s1 in the first direction x is connected to a second edge Y2 of the protrusion s2 in the second direction y so as to form an outer corner G. The outer corner G can be understood that a corner outside the gate electrode s. On the contrary, there is an inner corner N. The inner corner N in FIG. 9 is located inside the gate electrode s.

In an embodiment of FIG. 9, a gate electrodes has two outer corners G. The array substrate further includes a connection portion LL connected to the channel g. FIG. 9 is a top view, in which a top view angle is the same as a direction of orthographic projection to the substrate. It can be understood that in the top view, the connection portion L coincides with its orthographic projection on the substrate, and the outer corner G coincides with its orthographic projection on the substrate. Therefore, it can be seen from FIG. 9 that the orthographic projection of the connection portion LL on the substrate is located within the orthographic projection of the outer corner G on the substrate. In an embodiment, the connection portion LL is located in a same layer as the channel g. In this embodiment, the connection part LL is connected to the third subsection g3.

In a structure of the first transistor, a region overlapping with the gate electrodes in a direction perpendicular to the substrate is the channel g of the first transistor. In some embodiments, a change in the shape of the gate electrodes can affect the shape of the channel g. In an embodiment of the present disclosure, the shape of the channel can be adjusted by designing the shape of the gate electrode s. Taking an embodiment of FIG. 9 as an example, after the gate electrodes is designed to have an outer corner G, the total width, in the second direction y, of the channel g overlapping with the second zone Z2 can be adjusted, so that it is beneficial to reduce the difference in crystallization defects caused by the back edge of the laser beam scanning the channel g overlapping with the first zone Z1 and scanning the channel g overlapping with the second zone Z2, and the difference in the channel performance of the first transistor T1 in different pixels. In addition, in the array substrate, the gate electrodes is reused as an electrode plate of a storage capacitor in a pixel circuit. In an embodiment of FIG. 9, the gate electrodes is an irregular rectangular, so that an area of the gate electrode can be increased, thereby increasing capacitance of the storage capacitor to some extent.

In some embodiments, it can be seen from top views in FIG. 9 to FIG. 12 that an extension line of at least a portion of the fourth subsection g4 in its extension direction overlaps with the first edge Y1 in the direction perpendicular to the substrate. That is, by designing the shape of the gate electrodes to have an outer corner G, the total width, in the second direction y, of the channel in the region where the fourth subsection g4 is located can be adjusted. Comparing FIG. 8 and FIG. 10, it can be seen that when the gate electrodes is rectangular, the first zone Z1 overlaps with the fourth subsection g4 and the third part g3. After the gate electrodes is designed to have an outer corner G, the first zone Z1 only overlaps with the fourth subsection g4, so that the total width of the channel g, overlapping with the first zone Z1, in the second direction y can be adjusted, thereby reducing the difference in crystallization defects caused at different positions of the channel scanned by the back edge of the laser beam.

As shown in FIG. 9, FIG. 10 or FIG. 11, a gate electrodes includes two protrusions s2 respectively located at two ends of the body s1 in a second direction y. The gate electrodes has two outer corners G whose openings are opposite to each other. In an embodiment, influence of the shape of the gate electrodes on the shape of the channel g and influence of the area of the gate electrodes on the capacitance of the storage capacitor in the pixel circuit can be comprehensively considered to adjust the shape of the gate electrodes. The difference in crystallization defects caused by the back edge of the laser beam scanning the channel g that overlaps with the first zone Z1 and the channel g that overlaps with the second zone Z2 can be reduced by designing the shape of the gate electrode s, thereby reducing the difference in the channel performance of the first transistors T1 in different pixels. Meanwhile, the area of the gate electrode is achieved to be large enough to enable the capacitance of the storage capacitor to meet requirements.

Figure 13:
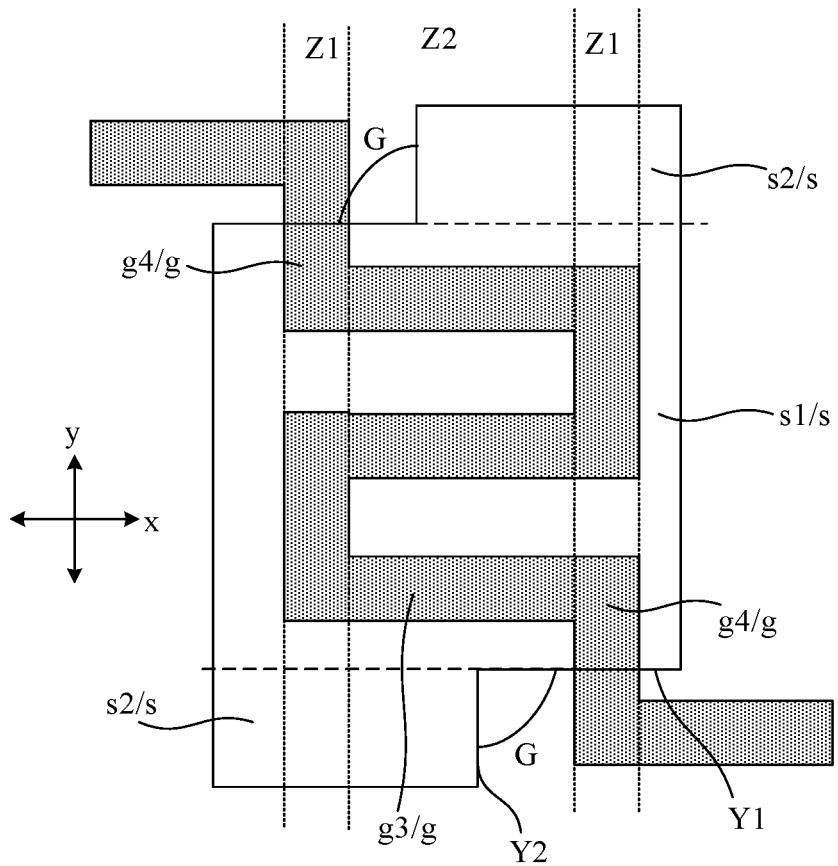
FIG. 13 is a schematic diagram showing a first transistor of an array substrate according to another embodiment of the present disclosure.

FIG. 13 is a schematic diagram showing a first transistor of an array substrate according to another embodiment of the present disclosure. In another embodiment, as shown in FIG. 13, the gate electrodes includes two protrusions s2 respectively located at two ends of the body s1 in the second direction y. The gate electrodes has two outer corners G whose openings are opposite to each other. In an embodiment, two protrusions s2 do not overlap with the channel g. The design of two protrusions s2 can increase the area of the gate electrode s, so that the capacitance of the storage capacitor in the pixel circuit can be increased.

In an embodiment, as shown in FIG. 12, the gate electrodes includes a body s1 and a protrusion s2. In an embodiment, if the protrusion s2 does not overlap with the channel g, the design of the protrusion s2 can increase the area of the gate electrodes, so that the capacitance of the storage capacitor in the pixel circuit can be increased.

Figure 14:
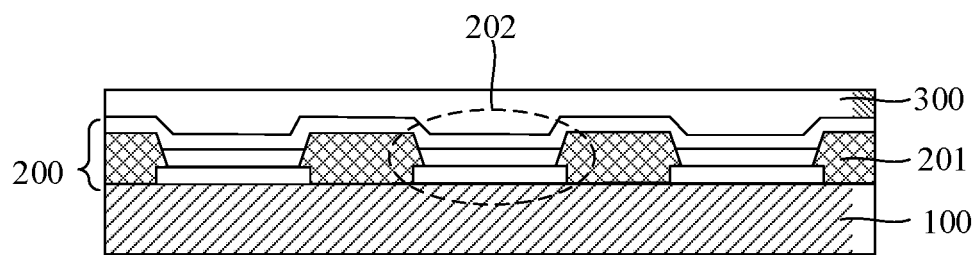
FIG. 14 is a schematic diagram showing a display panel according to an embodiment of the present disclosure.

The present disclosure also provides a display panel. FIG. 14 is a schematic diagram showing a display panel according to an embodiment of the present disclosure. As shown in FIG. 14, the display panel includes the array substrate according to any one of above embodiments, and a display layer 200 and an encapsulation structure 300 that are located on the substrate 100. The display layer 200 includes a pixel definition layer 201 and a light-emitting component 202. The light-emitting component 202 includes a first electrode, a light-emitting layer, and a second electrode that are stacked. In an embodiment, the light-emitting component 202 is an organic light-emitting diode. In another embodiment, the light-emitting component 202 is an inorganic light-emitting diode. The encapsulation structure 300 is configured to encapsulate and protect the light-emitting component 202. In an embodiment, the encapsulation structure 300 includes at least one inorganic encapsulation layer and at least one organic encapsulation layer.

Figure 15:
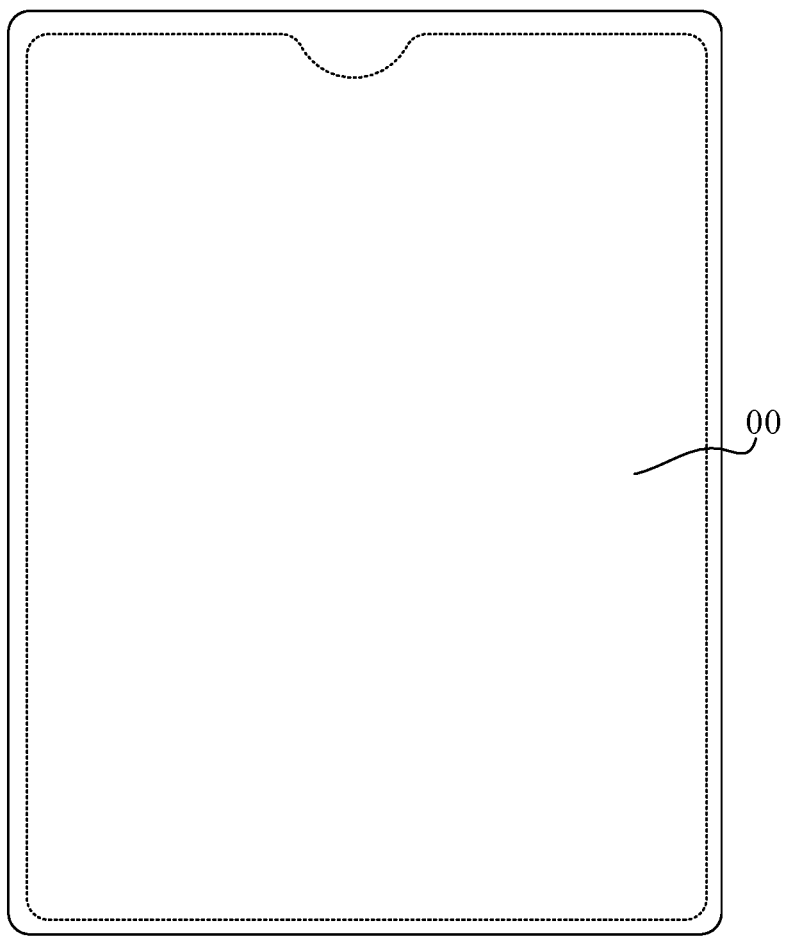
FIG. 15 is a schematic diagram showing a display apparatus according to an embodiment of the present disclosure.

The present disclosure also provides a display apparatus. FIG. 15 is a schematic diagram showing a display apparatus according to an embodiment of the present disclosure. As shown in FIG. 15, the display apparatus includes the display panel 00 provided by any one of the embodiments of the present disclosure. The display apparatus according to the present disclosure can be any device having a display function, such as a mobile phone, a tablet computer, a laptop computer, an electronic paper book, a television, a smart watch, or the like.

The above are merely some embodiments of the present disclosure, which, as mentioned above, are not intended to limit the present disclosure. Within the principles of the present disclosure, any modification, equivalent substitution, improvement shall fall into the protection scope of the present disclosure.

Finally, it should be noted that the technical solutions of the present disclosure are illustrated by the above embodiments, but not intended to limit thereto. Although the present disclosure has been described in detail with reference to the foregoing embodiments, those skilled in the art can understand that the present disclosure is not limited to the specific embodiments described herein, and can make various obvious modifications, readjustments, and substitutions without departing from the scope of the present disclosure.

What is claimed is:

1. An array substrate comprising:
a substrate; and
a first thin-film transistor located on the substrate,
wherein the first thin-film transistor comprises a channel and a gate electrode, wherein an orthographic projection of the gate electrode on the substrate overlaps with an orthographic projection of the channel on the substrate;
wherein the gate electrode has a first zone and a second zone that are arranged in a first direction;
wherein the channel overlapping with the first zone in a direction perpendicular to the substrate has a total width $W_1$ in a second direction perpendicular to the first direction, wherein the channel overlapping with the second zone in a direction perpendicular to the substrate has a total width $W_2$ in the second direction, and wherein $W_1/W_2 \leq 3$; and
wherein the substrate, the channel, and the gate electrode are sequentially arranged in the first direction, and a projection of the substrate on the channel is continuous and has an integral pattern.

2. The array substrate according to claim 1, wherein the channel comprises at least one first subsection and at least one second subsection, wherein each of the at least one first subsection extends in a third direction, wherein each of the at least one second subsection extends in the first direction, and wherein an angle θ formed between the third direction and the second direction satisfies 0°<θ<90°;
wherein in the direction perpendicular to the substrate, the first zone overlaps with one of the at least one first subsection and the second zone overlaps with one of the at least one second subsection; and
wherein one of the at least one first subsection has a width Wi in the second direction and one of the at least one second subsection has a width $W_2$ in the second direction.

3. The array substrate according to claim 2, wherein $\sinθ = W_2/W_1$.

4. The array substrate according to claim 2, wherein 19.5°≤θ<90°.

5. The array substrate according to claim 2, wherein one of the at least one first subsection has a width W3 in a direction perpendicular to the third direction, and wherein $W_3 < W_2$.

6. The array substrate according to claim 2, wherein the at least one second subsection comprises at least two second subsections, wherein one of the at least one first subsection of the channel comprises two ends, and wherein each of which is connected to one of the at least two second subsections; and
wherein a number of the at least one first subsection is n1, and wherein a number of the at least two second subsections is n2, where n1 and n2 each are a positive integer, and $n1+1=n2$.

7. The array substrate according to claim 1, wherein the channel comprises at least one third subsection and at least one fourth subsection, wherein each of the at least one fourth subsection extends along the first direction, wherein each of the at least one fourth subsection extends along the second direction, and wherein at least one end of one of the at least one fourth subsection is connected to one of the at least one third subsection.

8. The array substrate according to claim 7, wherein the at least one third subsection comprises at least two third subsections, wherein a number of the at least two third subsections is m2, wherein a number of the at least one fourth subsection is m2, wherein m2 and m2 each are a positive integer, and wherein m1≥m2.

9. The array substrate according to claim 7, wherein the first zone overlaps with a partial region of one of the at least one fourth subsection and a partial region of one of the at least one third subsection in the direction perpendicular to the substrate, wherein one of the at least one fourth subsection has a total length $D_1$ in the second direction, wherein the partial region of the one of the at least one third subsection has a total width $D_2$ in the second direction, and wherein $W_1 = D_1 + D_2$; and
wherein at least one of the at least one third subsection partially overlaps with the second zone in the direction perpendicular to the substrate and has a total width of $W_2$ in the second direction.

10. The array substrate according to claim 7, wherein one of the at least one third subsection overlaps with the first zone in the direction perpendicular to the substrate and has a total width of $W_1$ in the second direction; and
wherein one of the at least one fourth subsection overlaps with the second zone in the direction perpendicular to the substrate and has a total width of $W_2$ in the second direction.

11. The array substrate according to claim 7, wherein one of the at least one fourth subsection overlaps with the first zone in the direction perpendicular to the substrate and has a total width of $W_1$ in the second direction; and wherein one of the at least one third subsection overlaps with the second zone in the direction perpendicular to the substrate and has a total width of $W_2$ in the second direction.

12. The array substrate according to claim 7, wherein at least a portion of an orthographic projection of the channel on the substrate has a shape of a Chinese character "吕".

13. The array substrate according to claim 12, wherein the at least one third subsection comprises at least two third subsections, wherein one of the at least two third subsections has a width of $D_3$ in the second direction, wherein a space between two adjacent third subsections of the at least two third subsections in the second direction is $D_4$, and wherein $D_4 \leq 4D_3$.

14. The array substrate according to claim 7, further comprising:
a connection portion connected to the channel, wherein the gate electrode comprises a body and at least one protrusion, wherein one of the at least one protrusion is connected to one of ends of the body in the second direction and has a width smaller than a width of the body in the first direction;
wherein a first edge of the body in the first direction is connected to a second edge of one of the at least one protrusion in the second direction to form an outer corner, and wherein an orthographic projection of the connection portion on the substrate is located within an orthographic projection of the outer corner on the substrate.

15. The array substrate according to claim 14, wherein, in the direction perpendicular to the substrate, an extension line of at least a portion of one of the at least one fourth subsection in its extension direction overlaps with the first edge.

16. The array substrate according to claim 14, wherein the at least one protrusion comprises two protrusions located at two ends of the body in the second direction, respectively; wherein the gate electrode has two outer corners, and wherein two openings of the two outer corners are opposite to each other.

17. The array substrate according to claim 1, wherein $W_1/W_2 \leq 2$.

18. The array substrate according to claim 1, wherein the channel is made of a material comprising silicon.

19. A display panel, comprising an array substrate, wherein the array substrate comprises a substrate and a first thin-film transistor located on the substrate,
wherein the first thin-film transistor comprises a channel and a gate electrode, wherein an orthographic projection of the gate electrode on the substrate overlaps with an orthographic projection of the channel on the substrate;
wherein the gate electrode has a first zone and a second zone that are arranged in a first direction;
wherein the channel overlapping with the first zone in a direction perpendicular to the substrate has a total width $W_1$ in a second direction perpendicular to the first direction, wherein the channel overlapping with the second zone in a direction perpendicular to the substrate has a total width $W_2$ in the second direction, and wherein $W_1/W_2 \leq 3$; and
wherein the substrate, the channel, and the gate electrode are sequentially arranged in the first direction, and a projection of the substrate on the channel is continuous and has an integral pattern.

20. A display apparatus, comprising the display panel according to claim 19.

* * * * *